(12) United States Patent
Han et al.

(10) Patent No.: US 9,230,808 B2
(45) Date of Patent: Jan. 5, 2016

(54) METHOD OF FABRICATING SEMICONDUCTOR DEVICE USING PHOTO KEY

(71) Applicant: SAMSUNG ELECTRONICS CO., LTD., Suwon-si, Gyeonggi-do (KR)

(72) Inventors: Je-woo Han, Hwaseong-si (KR); Jun-ho Yoon, Suwon-si (KR); Dong-chan Kim, Seoul (KR); Gyung-jin Min, Seongnam-si (KR); Jae-hong Park, Seongnam-si (KR); Yong-moon Jang, Incheon (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 106 days.

(21) Appl. No.: 13/957,572

(22) Filed: Aug. 2, 2013

(65) Prior Publication Data

US 2014/0038383 A1 Feb. 6, 2014

(30) Foreign Application Priority Data

Aug. 6, 2012 (KR) .................. 10-2012-0086005

(51) Int. Cl.
| | |
|---|---|
| H01L 21/76 | (2006.01) |
| H01L 21/00 | (2006.01) |
| H01L 23/544 | (2006.01) |
| H01L 21/027 | (2006.01) |
| G03F 7/20 | (2006.01) |
| H01L 49/02 | (2006.01) |
| H01L 27/108 | (2006.01) |

(52) U.S. Cl.
CPC .......... *H01L 21/027* (2013.01); *G03F 7/70633* (2013.01); *H01L 23/544* (2013.01); *H01L 27/10894* (2013.01); *H01L 28/40* (2013.01); *H01L 2223/5446* (2013.01); *H01L 2223/54426* (2013.01); *H01L 2924/0002* (2013.01)

(58) Field of Classification Search
CPC ................. H01L 23/544; H01L 22/00; H01L 2223/54453; H01L 2223/54426; H01L 2223/5446; G03F 9/7073; G03F 7/70633; G03F 9/7084
USPC .................................. 257/797; 438/401, 462
See application file for complete search history.

(56) References Cited

U.S. PATENT DOCUMENTS

| | | | | |
|---|---|---|---|---|
| 4,272,776 | A * | 6/1981 | Weijland et al. | 257/511 |
| 6,809,002 | B2 * | 10/2004 | Yabe et al. | 438/401 |
| 6,933,204 | B2 * | 8/2005 | Sarma et al. | 438/401 |
| 7,332,395 | B2 | 2/2008 | Yokoi | |

(Continued)

FOREIGN PATENT DOCUMENTS

| | | | |
|---|---|---|---|
| JP | 3-268355 | * | 11/1991 |
| JP | 2011-517089 A | | 5/2011 |

(Continued)

*Primary Examiner* — Mary Wilczewski
*Assistant Examiner* — Erik T Peterson
(74) *Attorney, Agent, or Firm* — Lee & Morse, P.C.

(57) ABSTRACT

A method of fabricating a semiconductor device includes providing a substrate that is divided into a first region on which a pattern layer is formed and a second region on which a photo key is formed. A silicon layer is formed on the first region and second region of the substrate. The silicon layer is patterned to form a hole exposing a photo key portion of the second region on which the photo key is formed. A buried oxide layer is formed to fill the hole exposing the photo key portion. The silicon layer is patterned by using the photo key formed under the buried oxide layer to form a silicon pattern layer.

14 Claims, 14 Drawing Sheets

(56) References Cited

U.S. PATENT DOCUMENTS

| | | |
|---|---|---|
| 7,550,362 B2 | 6/2009 | Ban et al. |
| 7,723,178 B2 * | 5/2010 | Adkisson et al. ............ 438/221 |
| 7,863,149 B2 | 1/2011 | Kundalgurki et al. |
| 8,274,777 B2 | 9/2012 | Kiehlbauch |
| 2002/0005594 A1 * | 1/2002 | Iwamatsu .................... 257/797 |
| 2002/0048928 A1 * | 4/2002 | Nakagawa et al. ........... 438/619 |
| 2008/0203590 A1 * | 8/2008 | Kang et al. ................... 257/797 |
| 2008/0211063 A1 * | 9/2008 | Adachi et al. ................. 257/620 |
| 2010/0062548 A1 * | 3/2010 | Kwon et al. ...................... 438/7 |
| 2011/0294285 A1 * | 12/2011 | Kwon et al. ................. 438/585 |

FOREIGN PATENT DOCUMENTS

| | | |
|---|---|---|
| KR | 10-2006-0035473 A | 4/2006 |
| KR | 10-2007-0055243 A | 5/2007 |
| KR | 10-2007-0060349 A | 6/2007 |
| KR | 10-2007-0084722 A | 8/2007 |
| KR | 10-2008-0106650 A | 12/2008 |
| KR | 10-2009-0102071 A | 9/2009 |
| KR | 10-2010-0036006 A | 4/2010 |
| KR | 10-2010-0073096 A | 7/2010 |
| KR | 10-2012-0005253 A | 1/2012 |

* cited by examiner

| | MOLD SILICON LAYER | MOLD OXIDE LAYER |
|---|---|---|
| OVERLAY RESIDUAL | ABOUT 16nm | ABOUT 8nm |

…

METHOD OF FABRICATING SEMICONDUCTOR DEVICE USING PHOTO KEY

CROSS-REFERENCE TO RELATED APPLICATION

This application claims the benefit of Korean Patent Application No. 10-2012-0086005, filed on Aug. 6, 2012, in the Korean Intellectual Property Office, and entitled: "METHOD OF FABRICATING SEMICONDUCTOR DEVICE USING PHOTO KEY," the disclosure of which is incorporated herein in its entirety by reference.

BACKGROUND

1. Field

Embodiments relate to a method of fabricating a semiconductor device, and more particularly, to a method of fabricating a semiconductor device by using a photo key.

2. Description of the Related Art

Typically, when a semiconductor device is fabricated, a plurality of material layers is formed on a substrate and the material layers are patterned by photolithography to form pattern layers. Accordingly, there is a need to increase the accuracy of alignment or overlay of pattern layers sequentially formed by photolithography in the course of the fabrication of a semiconductor device.

SUMMARY

One or more embodiments are directed to providing a method of fabricating a semiconductor device, wherein the method includes providing a substrate that is divided into a first region on which a pattern layer is formed and a second region on which a photo key is formed, forming a silicon layer on the first region and the second region of the substrate, patterning the silicon layer to form a hole exposing a photo key portion of the second region on which the photo key is formed, forming a buried oxide layer to fill the hole exposing the photo key portion, and patterning the silicon layer using the photo key formed under the buried oxide layer to form a silicon pattern layer.

The buried oxide layer may be formed by using a damascene method.

Forming the buried oxide layer may include forming an oxide layer filling the hole on the entire surface of the first region and the second region and etching the oxide layer using the silicon layer as an etch stopper.

A liner layer may be further formed on a bottom and facing surfaces of the hole. Forming the silicon pattern layer may include forming a mask layer on the silicon layer and the buried oxide layer, forming a photoresist pattern on the mask layer at a higher level than the mask layer using the photo key formed under the buried oxide layer, etching a portion of the mask layer by using the photoresist pattern as an etch mask to form a mask pattern layer, removing the photoresist pattern, and etching portions of the silicon layer using the mask pattern layer as an etch mask.

When the photoresist pattern is formed, the photo key may function as an alignment key and an overlay key to align the photoresist pattern with the pattern layer formed on the substrate.

Etching portions of the silicon layer may include exposing the pattern layer formed on the first region.

The pattern layer may be formed as a metal layer, and the method may further include, after the formation of the silicon pattern layer, forming a conductive layer on the pattern layer of the first region and between silicon patterns that constitute the silicon pattern layer, removing the silicon pattern layer to form a lower conductive pattern layer, and sequentially forming a dielectric layer and an upper conductive pattern layer on the lower conductive pattern layer to form a capacitor.

The first region may be a cell and peripheral circuit region, and the second region may be a scribe line region.

One or more embodiments are directed to providing a method of fabricating a semiconductor device, wherein the method includes providing a substrate that is divided into a cell and peripheral circuit region on which a pattern layer is formed and a scribe line region on which a photo key is formed, forming a mold silicon layer on the cell and peripheral circuit region and the scribe line region of the substrate, forming a support layer on the mold silicon layer; patterning the mold silicon layer to form a hole exposing a photo key portion of the scribe line region on which the photo key is formed; forming a buried oxide layer to fill the hole exposing the photo key portion, forming a mask pattern layer on the support layer at a higher level than the pattern layer by using the photo key formed under the buried oxide layer, etching the support layer by using the mask pattern layer as an etch mask to form a support pattern layer, etching portions of the mold silicon layer by using the mask pattern layer and the support pattern layer as an etch mask to form a mold silicon pattern layer, forming a lower conductive pattern layer supported by the support pattern layer on the pattern layer of the cell and peripheral circuit region and between mold silicon patterns that constitute the mold silicon pattern layer, and removing a portion of the mold silicon pattern layer.

The method may further form an inner support layer inside the mold silicon layer.

The method may further include, following the forming of the buried oxide layer, forming a second support layer on the buried oxide layer and the support layer.

Forming the mask pattern layer may include forming a plurality of mask layers on the buried oxide layer and the mold silicon layer; forming a photoresist pattern on an uppermost mask layer of the mask layers at a higher level than the mask layer by using the photo key formed under the buried oxide layer; etching the uppermost mask layer by using the photoresist pattern as a mask to form a uppermost mask pattern layer; and sequentially etching portions of the other mask layers by using the uppermost mask pattern layer as an etch mask to form a mask pattern layer.

Removing the mold silicon layer may include: etching the support pattern layer and the mold silicon pattern layer to reduce a height of the mold silicon pattern layer; and etching the mold silicon pattern layer with the reduced height located on the cell and peripheral circuit region to remove the mold silicon pattern layer.

The method may further include, following the removing of the mold silicon pattern layer, sequentially forming a dielectric layer and an upper conductive pattern layer on the lower conductive pattern layer to form a capacitor.

One or more embodiments are directed to providing a method of fabricating a semiconductor device, wherein the method includes providing a substrate divided into a first region on which a first pattern layer is formed and a second region on which a photo key is formed, forming a first silicon pattern on the first region and the second region of the substrate, the first silicon pattern including hole exposing the photo key and covering the first region, filling the hole with a light-transmissive material, the light transmissive material being more light transmissive than silicon, providing a second pattern layer on the silicon pattern and the light-transmissive material, the second pattern layer being aligned with the photo key, and patterning the first silicon pattern using the second pattern layer to form a second silicon pattern.

The light-transmissive material may be a buried oxide layer.

The light-transmissive material may have an upper surface level with an upper surface of the silicon pattern.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
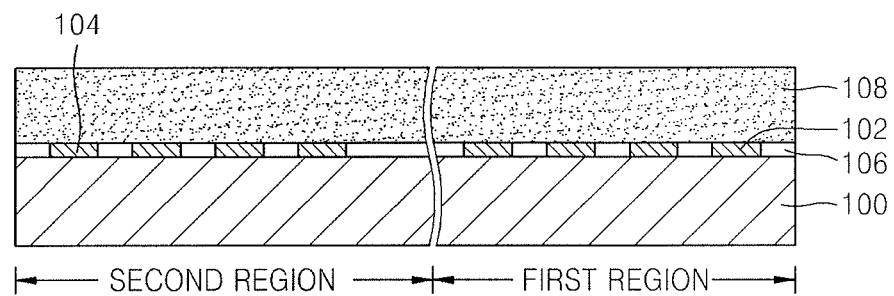
FIGS. 1 to 6 illustrate cross-sectional views of stages in a method of fabricating a semiconductor device, according to an embodiment.

As used herein, the term "and/or" includes any and all combinations of one or more of the associated listed items.

Embodiments will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey example implementations to one of ordinary skill in the art. Particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed herein. In the drawings, dimensions of structures illustrated therein may be enlarged or reduced to increase accuracy of the inventive concept.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure may be embodied in any one embodiment or in combination of a plurality of embodiments. Hereinafter, like reference numerals refer to like elements. Hereinafter, an oxide layer may refer to a silicon oxide layer, and a nitride layer may refer to a silicon nitride layer.

FIGS. 1 to 6 illustrate cross-sectional views of stages in a method of fabricating a semiconductor device, according to an embodiment.

Referring to FIG. 1, a substrate 100 is divided into a first region on which a pattern layer 102 is formed and a second region on which a photo key 104 is formed. The substrate 100 may be a silicon substrate. The first region may be a cell/peripheral region (cell and peripheral circuit region). The second region may be a scribe line region or a scribe lane region. The pattern layer 102 may be any one of various layers that are formed on the substrate 100, for example, a conductive layer or an insulating layer. The pattern layer 102 may be a pattern layer for forming a device. The pattern layer 102 may include a plurality of patterns. A transistor (not shown) and an impurity region (not shown) may be formed on the first region.

The photo key 104 of the second region may be formed of a same material as used to form the pattern layer 102. The photo key 104 may include a plurality of patterns. The pattern layer 102 and the photo key 104 may be insulated by an insulating layer 106. The insulating layer 106 may be an oxide layer. A mold silicon layer 108 may be formed on the first region and the second region. The mold silicon layer 108 may be formed on the pattern layer 102 and the photo key 104.

Figure 2:
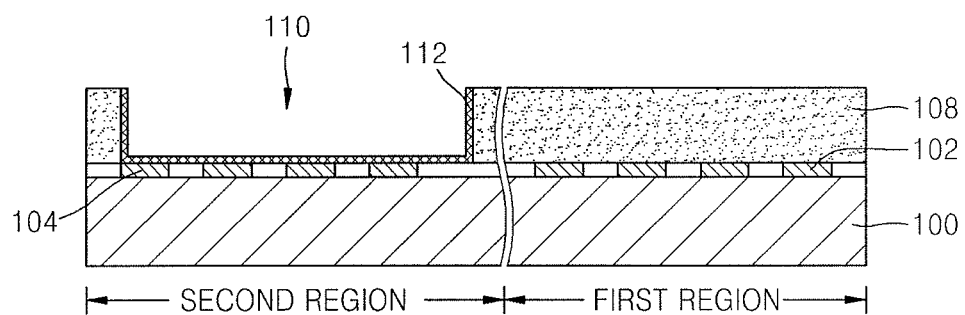

Referring to FIG. 2, the mold silicon layer 108 may be patterned to form a hole 110 exposing a photo key portion of the second region on which the photo key 104 is formed. The hole 110 may be formed by performing a photolithography process on the silicon layer 108. The hole 110 is formed to replace the silicon layer 108 of the second region that is located at the same level as the mold silicon layer 108 of the first region with another material.

A liner layer 112 may be formed on a bottom and side walls of the hole 110. The liner layer 112 may be a nitride layer. The liner layer 112 may be formed to prevent etching of a buried oxide layer which is to be formed in a subsequent process. The liner layer 112 may have a thickness of about 150 Å to about 250 Å.

Figure 3:
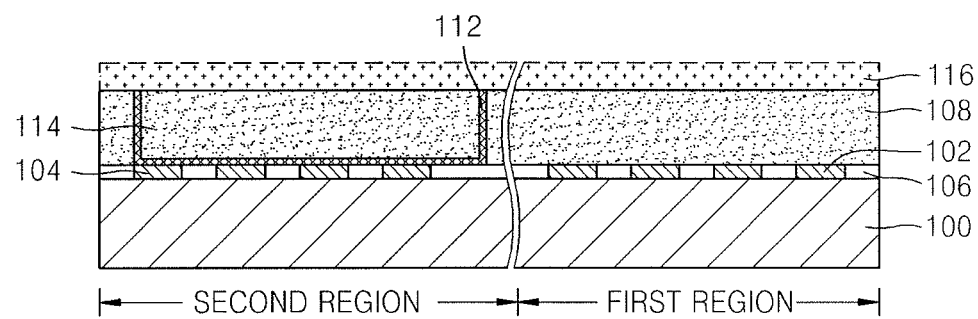

Referring to FIG. 3, a buried oxide layer 114 may be formed to fill the hole 110 exposing the photo key 104. The buried oxide layer 114 may be formed by using a damascene method. The buried oxide layer 114 may be formed by forming an oxide layer 116 filling the hole 110 on the first second region, and etching, for example, etching-back or chemical-mechanical-polishing the oxide layer 116 by using the silicone layer 108 as an etch stopper.

By performing such processes, the mold silicon layer 108 of the second region that is located at the same level as the mold silicon layer 108 of the first region may be replaced with the buried oxide layer 114. The buried oxide layer 114 formed on the photo key 104 of the second region may be more light-transmissible than the silicon layer 108 of the first region. Accordingly, the photo key 104 of the second region may easily function as an alignment key and an overlay key during an exposure process or an overlay evaluation process.

Figure 4:
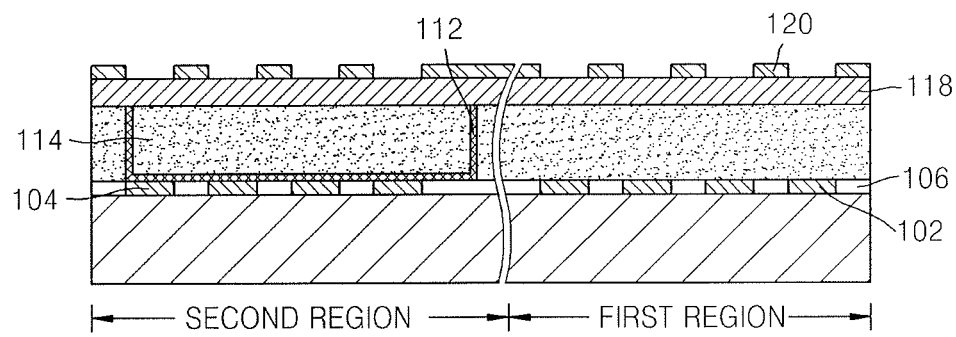

Referring to FIG. 4, a mask layer 118 may be formed on the silicon layer 108 and the buried oxide layer 114. The mask layer 118 may be formed as a material layer having an etch selectivity with respect to the mold silicon layer 108 and the buried oxide layer 114. The mask layer 118 may be formed as a nitride layer.

A photoresist pattern 120 may be formed on the mask layer 118. The photoresist pattern 120 may be formed on the mask layer 118 located at a higher level than the pattern layer 102 by using the photo key 104 formed under the buried oxide layer 114 in such a way that the photoresist pattern 120 aligns with the pattern layer 102.

When the photoresist pattern 120 is formed, the photo key 104 may function as an alignment key and an overlay key to align the photoresist pattern 120 with the pattern layer 102 formed on the substrate 100. As described above, since the buried oxide layer 114 formed on the photo key 104 on the second region is more light-transmissible than the mold silicon layer 108 of the first region, the photo key 104 of the second region may easily function as an alignment key and an overlay key during an exposing process or an overlay evaluation process to align the photoresist pattern 120 with the pattern layer 102. As would be apparent to one of ordinary skill from the foregoing description and the drawings, photoresist of the photoresist pattern 120 may overlap, e.g., entirely overlap, empty regions of the pattern layer 102.

Figure 5:
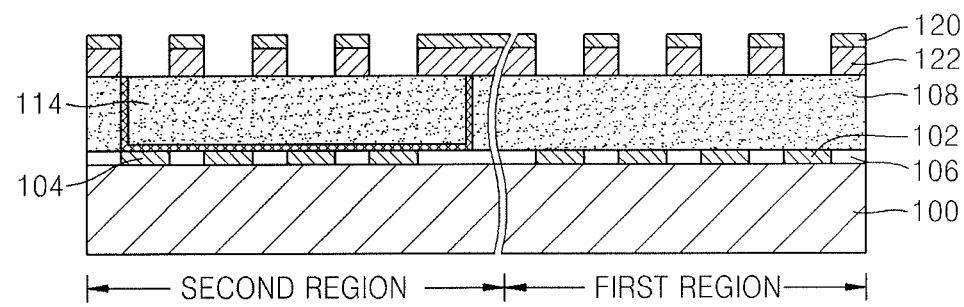
Figure 6:
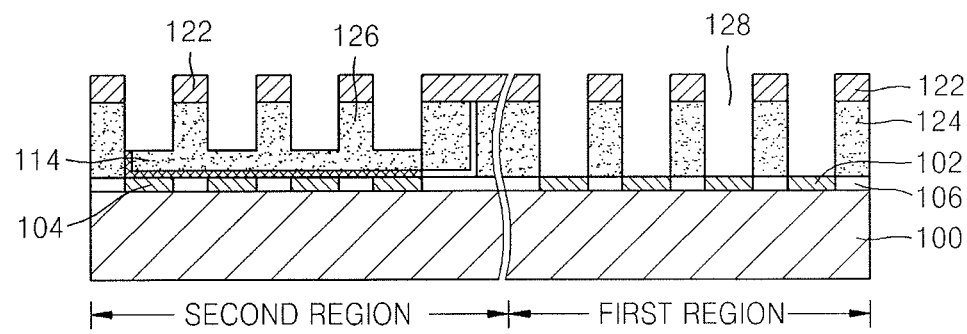

Referring to FIGS. 5 and 6, as illustrated in FIG. 5, the mask layer 118 is etched by using the photoresist pattern 120 as an etch mask to form a mask pattern layer 122. Subsequently, the photoresist pattern 120 is removed, and then, as illustrated in FIG. 6, the silicon layer 108 is etched by using the mask pattern layer 122 as an etch mask to form a silicon pattern layer 124. When the mold silicon layer 108 is etched, a hole 128 exposing the pattern layer 102 formed on the first region may be formed.

When the silicon pattern layer 124 is formed, a portion of the buried oxide layer 114 may be etched to form a buried oxide pattern layer 126. That is, according to an embodiment, the mold silicon layer 108 is patterned using the photo key 104 formed under the buried oxide layer 114 to align the pattern layer 102 with the silicon pattern layer 124 located at a higher level of the pattern layer 102.

FIGS. 7 to 13 illustrate cross-sectional views of stages in a method of fabricating a semiconductor device, according to another embodiment. In detail, the method of manufacturing a semiconductor device, according to the present embodiment, is an example of applying the method according to the previous embodiment to form a capacitor.

Figure 7:
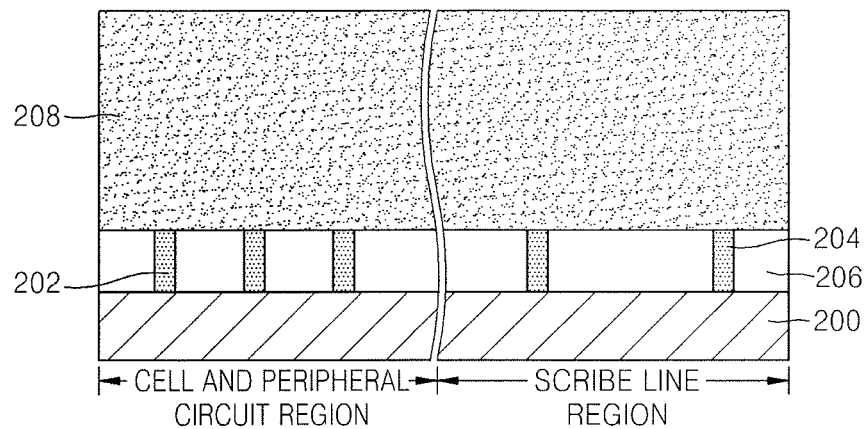
FIGS. 7 to 13 illustrate cross-sectional views of stages in a method of fabricating a semiconductor device, according to another embodiment.

Referring to FIG. 7, a substrate 200 is divided into a cell/peripheral circuit region (cell and peripheral circuit region) on which a pattern layer 202 is formed and a scribe line region on which a photo key 204 is formed. The substrate 200 may be a silicon substrate. The pattern layer 202 may be a pattern layer for forming a device. The pattern layer 202 may be a metal layer, e.g., a bit line pattern. The pattern layer 202 may include a plurality of patterns. The pattern layer 202 may be formed in the form of a contact plug. A transistor (not shown) and an impurity region (not shown) may be formed on the cell/peripheral circuit region.

The photo key 204 and the pattern layer 202 may be formed of a same material. The photo key 204 may include a plurality of patterns. The photo key 204 may be formed in the form of a contact plug. The pattern layer 202 and the photo key 204 may be insulated by an interlayer insulating layer 206, e.g., an oxide layer.

A mold silicon layer 208 may be formed on the cell/peripheral circuit region and the scribe line region. The mold silicon layer 208 may be formed on the pattern layer 202 and the photo key 204. The mold silicon layer 208 may be a material layer that may function as a mold. The mold silicon layer 208 is a relatively thick layer, e.g., may have a thickness of about 10,000 Å to about 20,000 Å.

The mold silicon layer 208 is formed into a mold silicon pattern layer (see 224 of FIG. 12) in a subsequent process. The mold silicon pattern layer (see 224 of FIG. 12) may provide an increased aspect ratio compared to a mold oxide pattern layer, thereby improving capacitance. In addition, compared to a mold oxide pattern layer, the mold silicon pattern layer (see 224 of FIG. 12) may not undergo a phenomenon in which a lower width is smaller than an upper width. Compared to a mold oxide pattern layer, a mold silicon pattern layer (see 224 of FIG. 12) may unlikely bend or fall down even when an aspect ratio increases.

Figure 8:
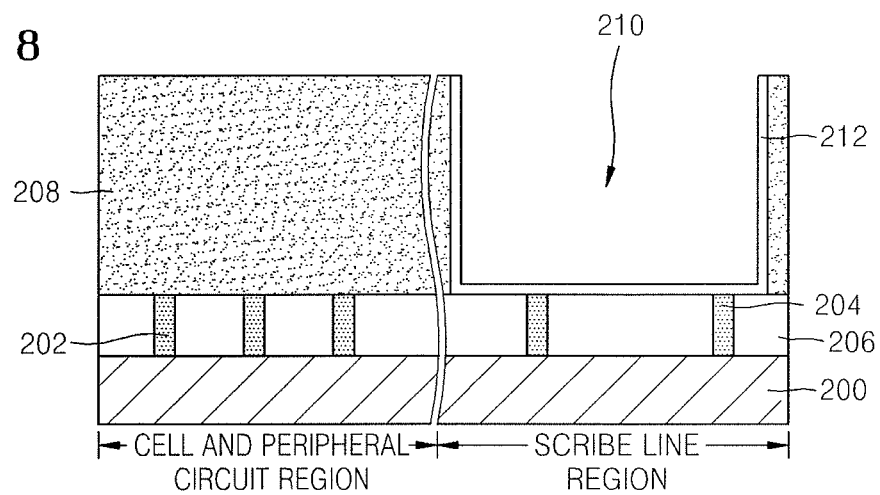
Figure 9:
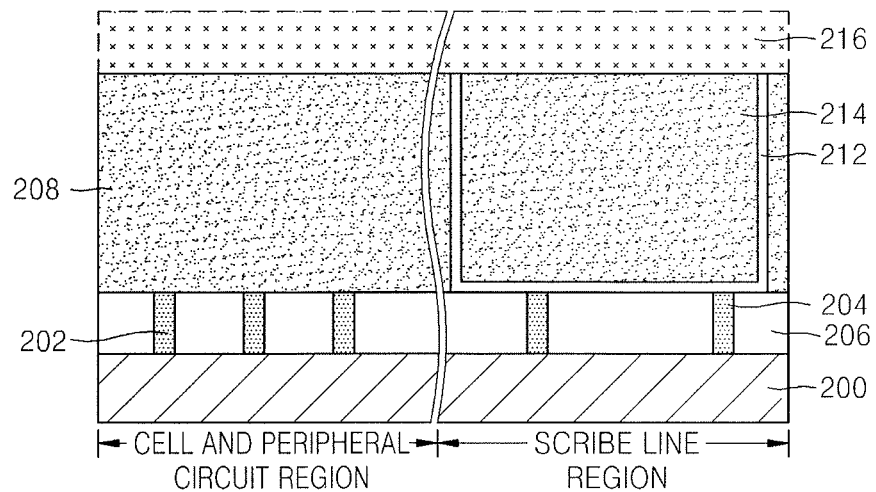

Referring to FIGS. 8 and 9, the mold silicon layer 208 is patterned to form a hole 210 exposing a photo key portion of the scribe line region on which the photo key 204 is formed. The hole 210 is formed to replace the mold silicon layer 208 of the scribe line region that is located at the same level as the mold silicon layer 208 of the cell/peripheral circuit region with another material. A liner layer 212, e.g., a nitride layer, may be formed on a bottom and facing walls of the hole 210. The liner layer 212 may be formed to prevent etching of a buried oxide layer which is formed in a subsequent process. A thickness of the liner layer 212 may be in a range of about 150 Å to about 250 Å.

Then, as illustrated in FIG. 9, a buried oxide layer 214 may be formed to fill the hole 210 exposing the photo key portion on which the photo key 204 is formed. The buried oxide layer 214 may be formed using a damascene method. That is, the buried oxide layer 214 may be formed by forming an oxide layer 216 covering the hole 210 on the entire surface of the scribe line region and the cell/peripheral circuit region, followed by etching, e.g., etching back or chemical mechanical polishing (CMP) the oxide layer 216, using the mold silicon layer 208 as an etch stopper.

Through these processes, the mold silicon layer 208 of the scribe line region that is located at the same level as the mold silicon layer 208 of the cell/peripheral circuit region may be replaced with the buried oxide layer 214. The buried oxide layer 214 formed on the photo key portion of the scribe line region may be more light-transmissible than the mold silicon layer 208 of the cell/peripheral circuit region. Accordingly, the photo key 204 of the scribe line region may function as an alignment key and an overlay key in an exposing process or an overlay evaluation process.

Figure 10:
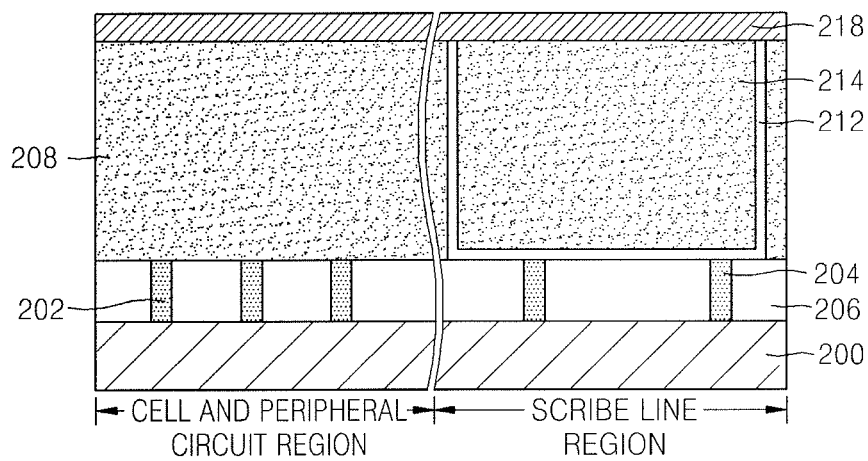
Figure 11:
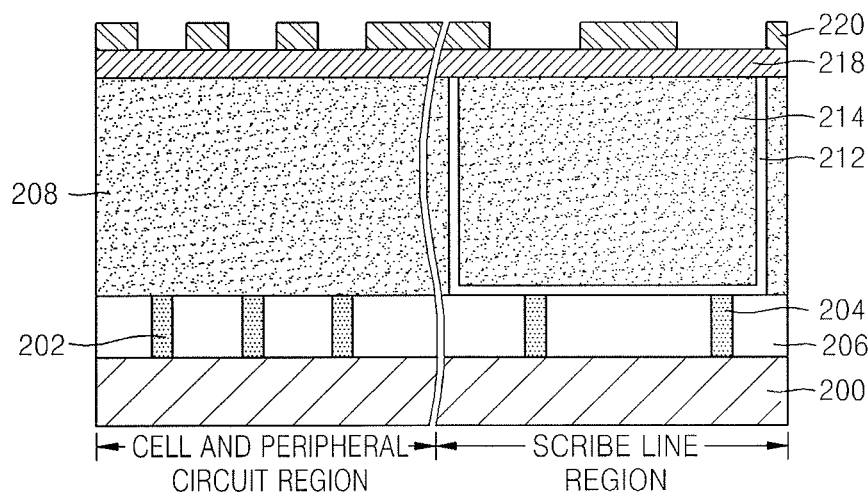

Referring to FIGS. 10 and 11, a mask layer 218 may be formed on the mold silicon layer 208 and the buried oxide layer 214. As illustrated in FIG. 11, a photoresist pattern 220 may be formed on the mask layer 218. The photoresist pattern 220 may be formed on the mask layer 218 that is located at an upper level than the pattern layer 202 by using the photo key 204 formed under the buried oxide layer 214 in such a way that the photoresist pattern 220 aligns with the pattern layer 202. As would be apparent to one of ordinary skill from the foregoing description and the drawings, photoresist of the photoresist pattern 220 may overlap, e.g., partially overlap, empty regions of the pattern layer 202.

Figure 12:
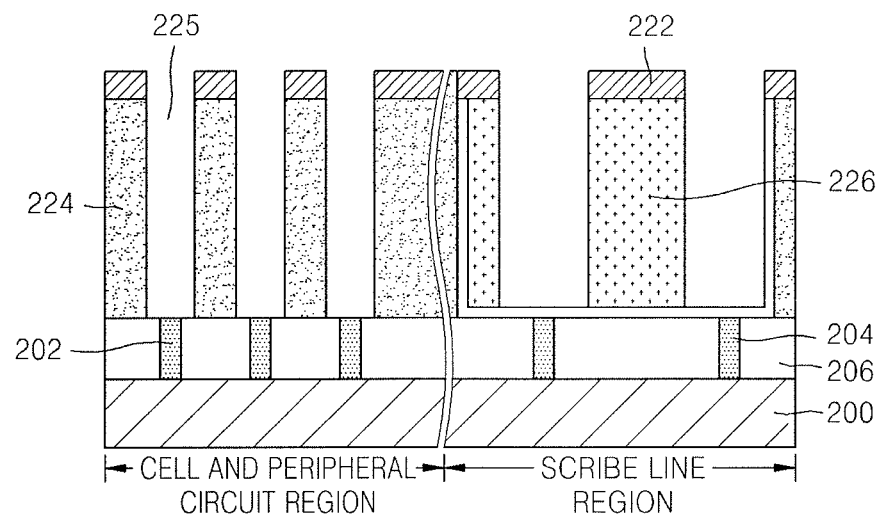

Referring to FIG. 12, a portion of the mask layer 218 may be etched by using the photoresist pattern 220 as an etch mask to form a mask pattern layer 222. Subsequently, the photoresist pattern 220 is removed, and then, a portion of the mold silicon layer 208 may be etched by using the mask pattern layer 222 as an etch mask to form a mold silicon pattern layer 224. When the portion of the mold silicon layer 208 is etched, a hole 225 exposing the pattern layer 202 formed on the cell/peripheral circuit region may be formed. When the mold silicon pattern layer 224 is formed, a portion of the buried oxide layer 214 may be etched to form a buried oxide pattern layer 226.

As described above, the mold silicon layer 208 is patterned by using the photo key 204 formed under the buried oxide layer 214 to align the mold silicon pattern layer 224 located at an upper level than the pattern layer 202 with the pattern layer 202.

Figure 13:
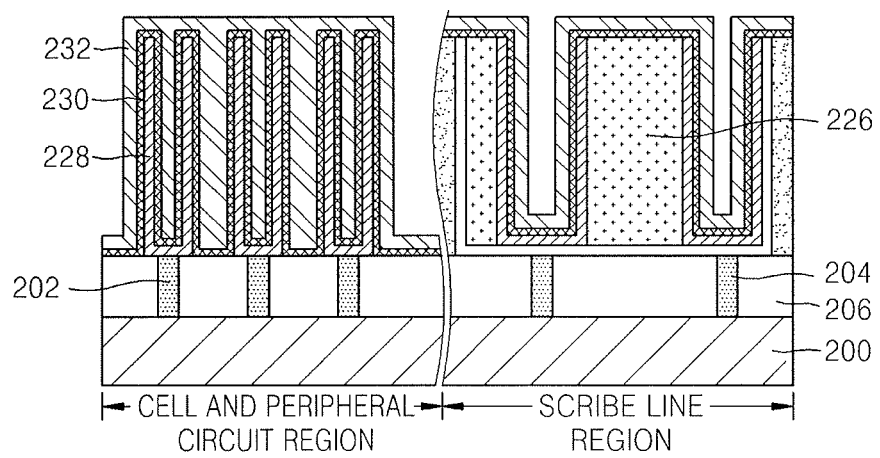

Referring to FIG. 13, after the mask pattern layer 222 is removed, a conductive layer (not shown) may be formed on the pattern layer 202 of the cell/peripheral circuit region and between mold silicon patterns that constitute the mold silicon pattern layer 224. The conductive layer may be a metal layer, for example, a titanium/titanium nitride layer. Subsequently, the mold silicon pattern layer 224 is removed to form a lower conductive pattern layer 228. The lower conductive pattern layer 228 may be formed in a cylinder shape. The mold silicon pattern layer 224 may be removed using, e.g., fluoric acid or limulus amebocyte lysate (LAL).

A dielectric layer 230 and an upper conductive pattern layer 232 are sequentially formed on the lower conductive pattern layer 228 to form a capacitor. The upper conductive pattern layer 232 may be a metal layer, e.g., a titanium/titanium nitride layer or a SiGe layer.

FIGS. 14 to 26 illustrate cross-sectional views of stages in a method of fabricating a semiconductor device, according to another embodiment of the inventive concept. In detail, the method of manufacturing a semiconductor device, according to the present embodiment, is an example of applying the method according to the previous embodiment to form a capacitor.

Figure 14:
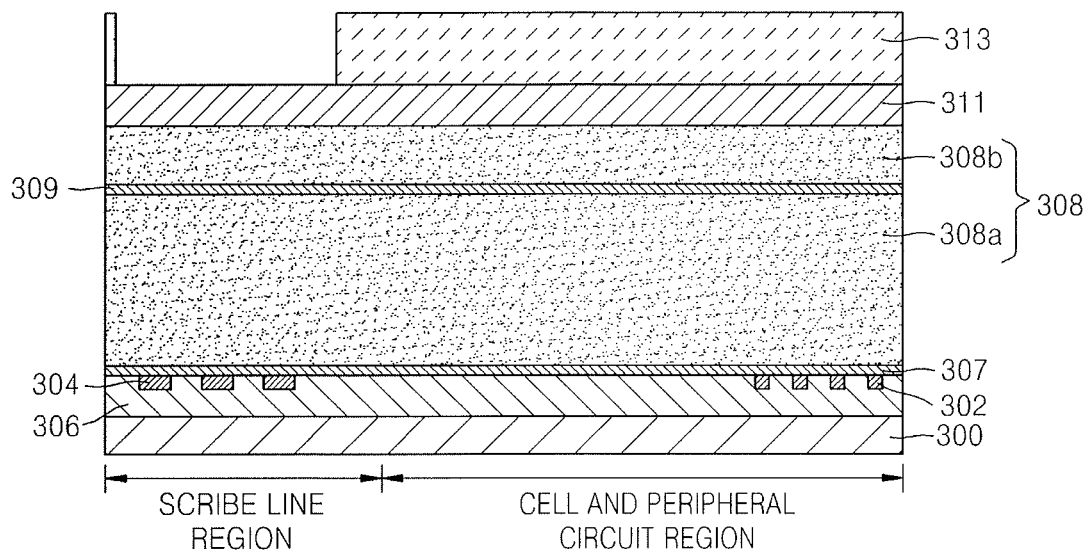
FIGS. 14 to 26 illustrate cross-sectional views of stages in a method of fabricating a semiconductor device, according to another embodiment.

Referring to FIG. 14, a substrate 300 is divided into a cell/peripheral circuit region (cell and peripheral circuit region) on which a pattern layer 302 is formed and a scribe line region on which a photo key 304 is formed. The substrate 300 may be a silicon substrate. The pattern layer 302 may be a pattern layer for forming a device. The pattern layer 302 may be a metal layer, e.g., a bit line pattern. The pattern layer 302 and the photo key 304 may be insulated by an interlayer insulating layer 306, e.g., an oxide layer. A first liner layer 307 may be formed on the pattern layer 302, the photo key 304, and the interlayer insulating layer 306. The first liner layer 307 may have a thickness of about 150 Å to about 250 Å. The first liner layer 307 may be a nitride layer.

A mold silicon layer 308 may be formed on the cell/peripheral circuit region and the scribe line region. The mold silicon layer 308 may consist of a lower mold silicon layer 308a and an upper mold silicon layer 308b. The mold silicon layer 308 may be a material layer that may function as a mold. The mold silicon layer 308 may be a relatively thick layer, e.g., may have a thickness of about 10,000 to about 20,000 Å.

The mold silicon layer 308 is formed into a mold silicon pattern layer (see 324 of FIG. 21) in a subsequent process. The mold silicon pattern layer (see 324 of FIG. 21) may provide an increased aspect ratio compared to a mold oxide pattern layer, thereby improving capacitance. In addition, compared to a mold oxide pattern layer, the mold silicon pattern layer (see 324 of FIG. 21) may not undergo a phenomenon in which a lower width is smaller than an upper width. Compared to a mold oxide pattern layer, a mold silicon pattern layer (see 324 of FIG. 21) may unlikely bend or fall down even when an aspect ratio increases.

An inner support layer 309 may be formed between the lower mold silicon layer 308a and the upper mold silicon layer 308b. The inner support layer 309 may be a nitride layer. A first support layer 311 may be formed on the mold silicon layer 308, that is, the upper mold silicon layer 308b. The first support layer 311 may be a nitride layer.

When the mold silicon layer 308 is formed into a silicon pattern layer in a subsequent process, compared to an oxide pattern layer, the mold silicon layer 308 may not fall down and may have a reduced pattern width difference between upper and lower portions thereof. A first photoresist pattern 313 exposing the first support layer 311 of the scribe line region may be formed on the first support layer 311.

Figure 15:
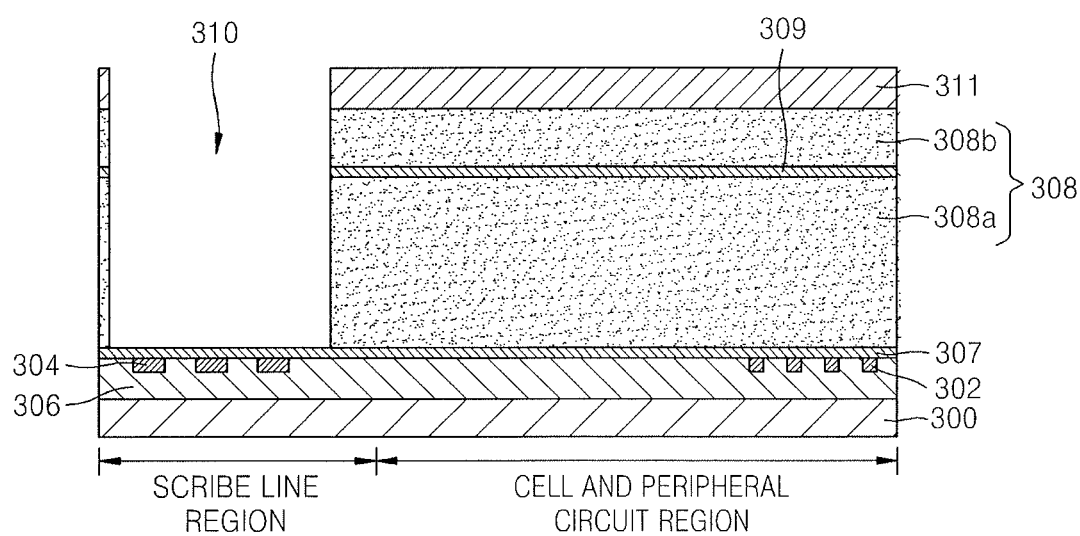

Referring to FIG. 15, portions of the first support layer 311, the mold silicon layer 308, and the inner support layer 309 are etched by using the first photoresist pattern 313 as an etch mask to form a hole 310 exposing a photo key portion of the scribe line region. In other words, the first support layer 311, the mold silicon layer 308, and the inner support layer 309 are patterned to form the hole 310 exposing a photo key portion of the scribe line region. The hole 310 is formed to replace the mold silicon layer 308 of the scribe line region that is located at the same level as the mold silicon layer 308 of the cell/peripheral circuit region with another material.

Figure 16:
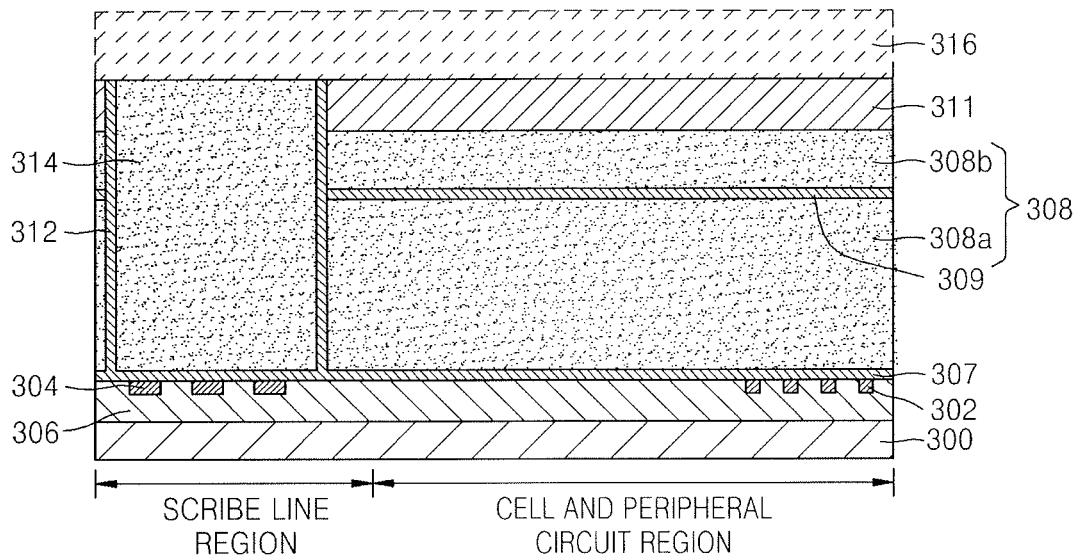

Referring to FIG. 16, a second liner layer 312, e.g., a nitride layer, may be formed on a bottom and facing walls of the hole 310. The second liner layer 312 may have a thickness of about 150 Å to about 250 Å. The second liner layer 312 may be formed to protect a buried oxide layer when a mold silicon pattern layer is removed in a subsequent process.

Then, a buried oxide layer 314 may be formed to fill the hole 310 exposing the photo key portion on which the photo key 304 is formed. The buried oxide layer 314 may be formed using a damascene method. That is, the buried oxide layer 314 may be formed by forming the an oxide layer 316 filling the hole 310 on the entire surface of the scribe line region and the cell/peripheral circuit region, followed by etching, e.g., etching back or chemical mechanical polishing the oxide layer 316 by using the first support layer 311 as an etch stopper.

Through these processes, the mold silicon layer 308 of the scribe line region that is located at the same level as the mold silicon layer 308 of the cell/peripheral circuit region may be replaced with the buried oxide layer 314. The buried oxide layer 314 formed on the photo key portion of the scribe line region may be more light-transmissible than the mold silicon layer 308 of the cell/peripheral circuit region. Accordingly, the photo key 304 of the scribe line region may function as an alignment key and an overlay key in an exposing process or an overlay evaluation process.

Figure 17:
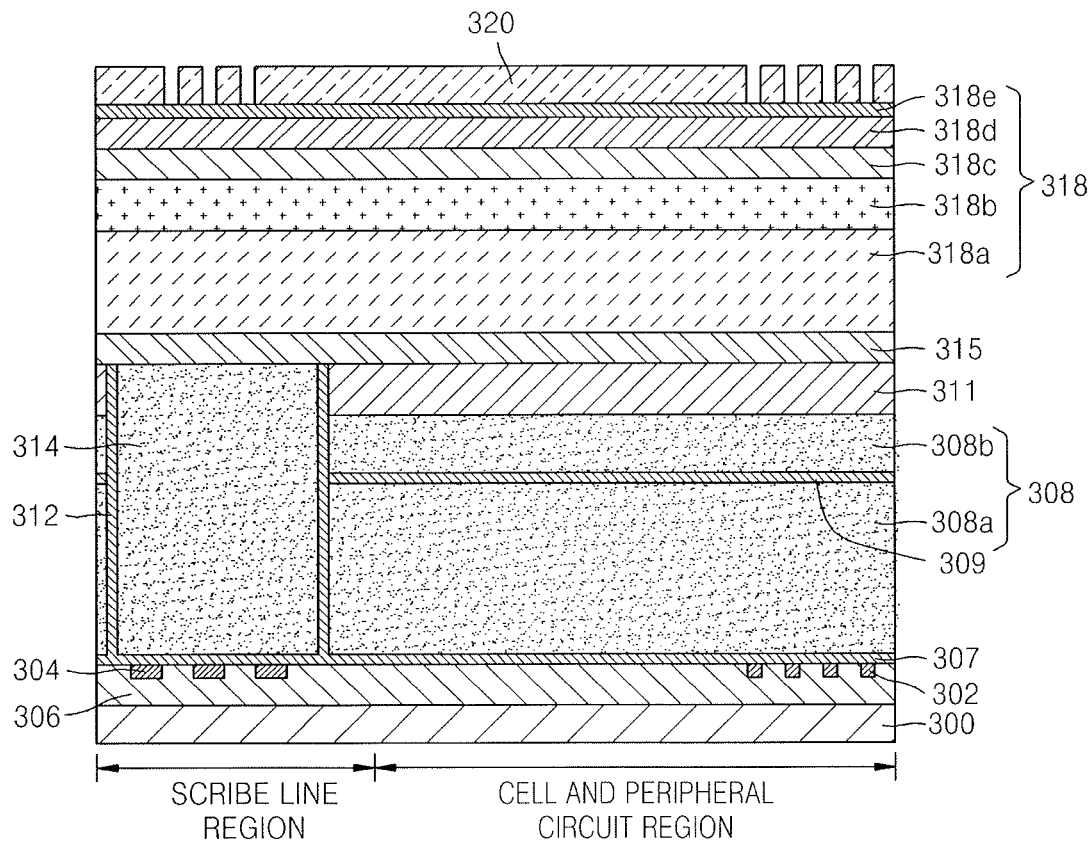
Figure 18:
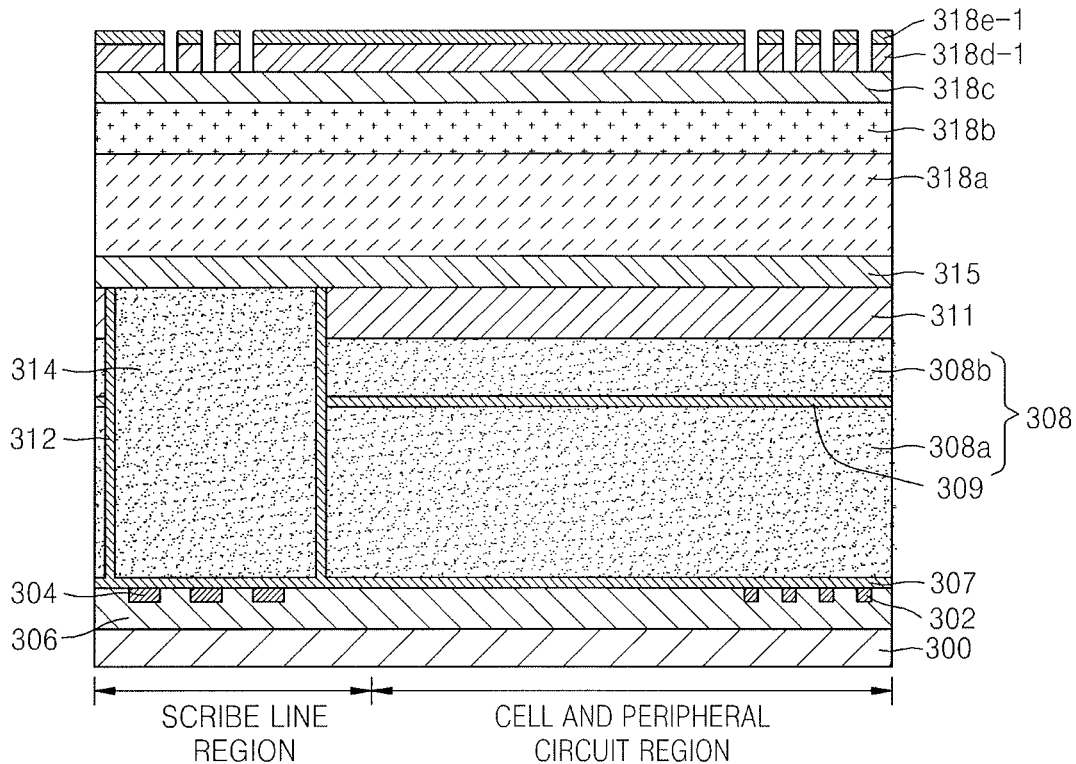

Referring to FIGS. 17 and 18, a second support layer 315 may be further formed on the buried oxide layer 314 and the first support layer 311. The second support layer 315 may function as a protection layer for protecting the buried oxide layer 314. The second support layer 315 may be a nitride layer.

A plurality of mask layers 318 may be formed on the second support layer 315. The mask layers 318 may consist of a first oxide layer 318a, a polysilicon layer 318b, a second oxide layer 318c, a reflection-prevention layer 318d, and a nitride layer 318e. The first oxide layer 318a may have a thickness of about 8000 Å to about 10000 Å, the polysilicon layer 318b may have a thickness of about 4000 Å to about 6000 Å, the second oxide layer 318c may have a thickness of about 1000 Å to about 3000 Å, the reflection-prevention layer 318d may have a thickness of about 1000 Å to about 3000 Å, and the nitride layer 318e may have a thickness of about 500 Å to about 1000 Å. Among the mask layers 318, the nitride layer 318e may be an uppermost mask layer. The mask layers 318 may be formed on the second support layer 315 to pattern the mold silicon layer 308 finely in a subsequent process in correspondence to high-integration of a semiconductor device.

A second photoresist pattern 320 may be formed on the nitride layer 318e, which is the uppermost mask layer of the mask layers 318. The second photoresist pattern 320 may be formed on the nitride layer 318e, which is the uppermost mask layer of the mask layers 318, by using the photo key 304 formed under the buried oxide layer 314 in such a way that the second photoresist pattern 320 aligns with the pattern layer 302. As would be apparent to one of ordinary skill from the foregoing description and the drawings, photoresist of the photoresist pattern 320 may overlap, e.g., completely overlap, empty regions of the pattern layer 302.

Subsequently, as illustrated in FIG. 18, portions of the nitride layer 318e and the reflection-prevention layer 318d are etched by using the second photoresist pattern 320 as a mask to form an uppermost mask pattern layer 318e-1 and a reflection-prevention pattern layer 318d-1. Subsequently, the second photoresist pattern 320 is removed.

Figure 19:
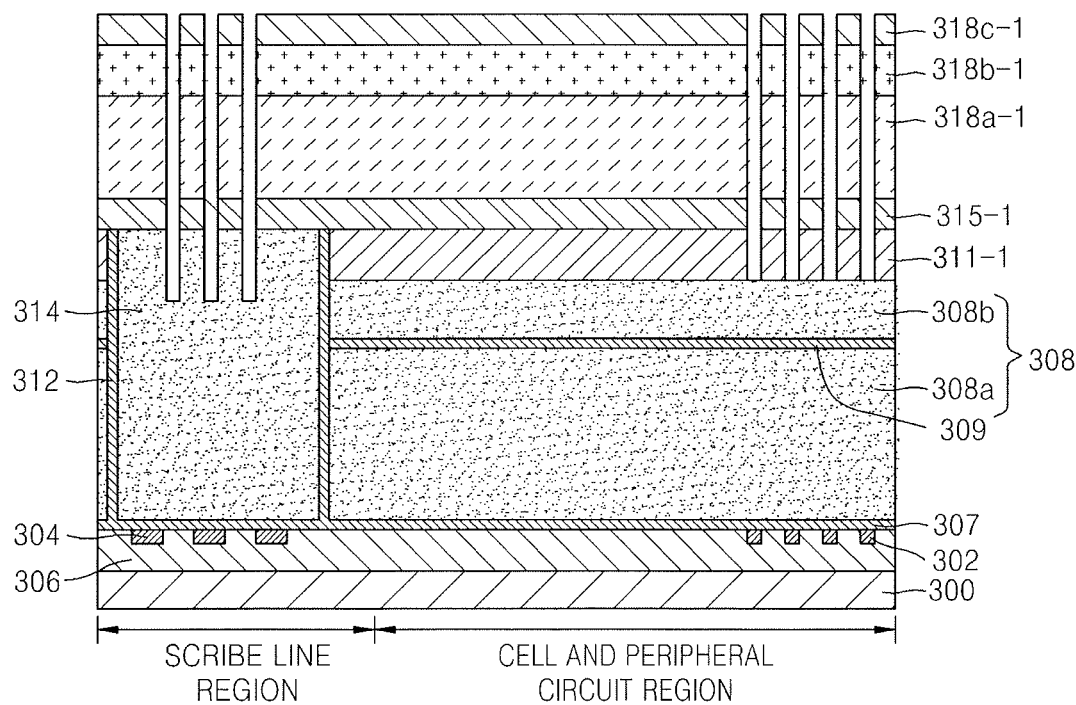

Referring to FIG. 19, a portion of the second oxide layer 318c is etched by using the uppermost mask pattern layer 318e-1 and the reflection-prevention pattern layer 318d-1 as an etch mask to form a second oxide pattern layer 318c-1. When the second oxide layer 318c is etched to form the second oxide pattern layer 318c-1, the uppermost mask pattern layer 318e-1 and the reflection-prevention pattern layer 318d-1 may be removed. Subsequently, portions of the polysilicon layer 318b, the first oxide layer 318a, the second support layer 315, and the first support layer 311 are etched using the second oxide pattern layer 318c-1 as an etch mask to form a polysilicon pattern layer 318b-1, a first oxide pattern layer 318a-1, a second support pattern layer 315-1, and a first support pattern layer 311-1, respectively. When the polysilicon layer 318b, the first oxide layer 318a, the second support layer 315, and the first support layer 311 are etched, part of the buried oxide layer 314 located on the scribe line region may also be etched.

Figure 20:
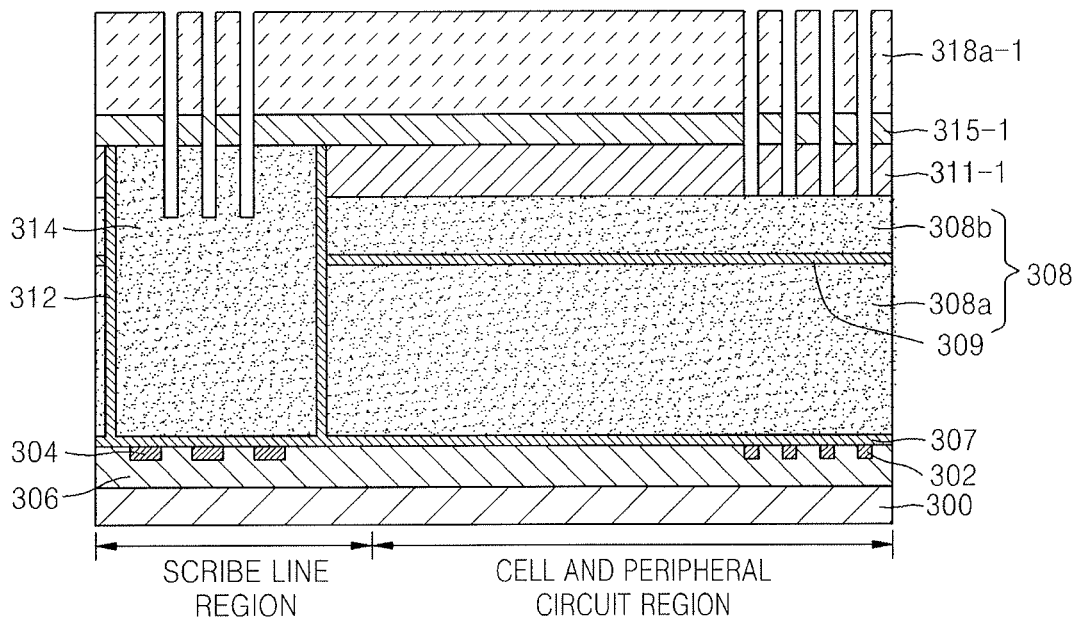
Figure 21:
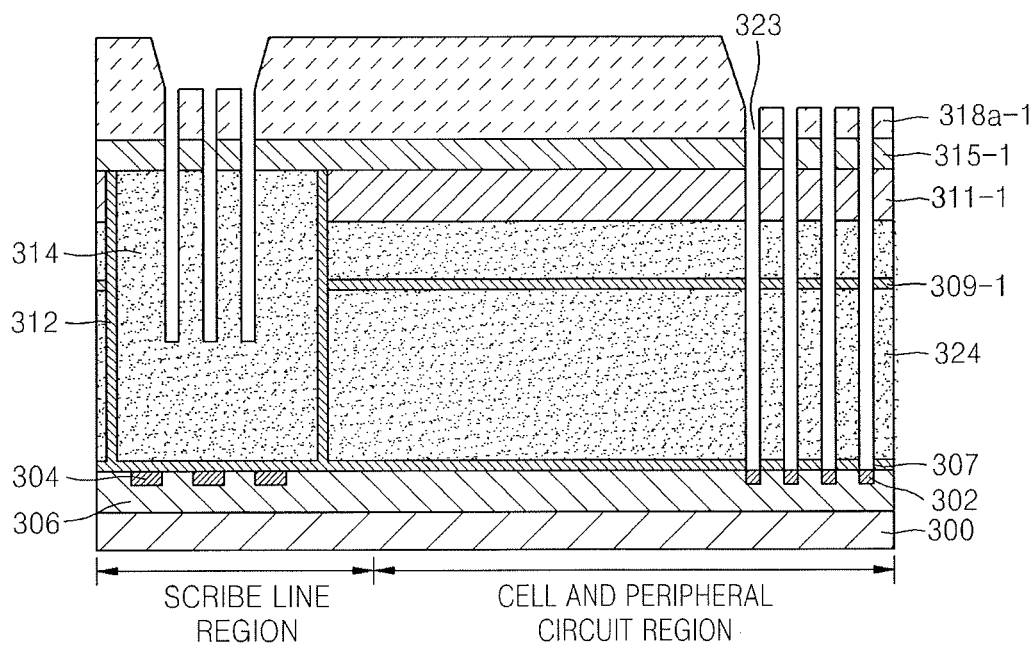

Referring to FIGS. 20 and 21, the second oxide pattern layer 318c-1 and the polysilicon pattern layer 318b-1 are removed. Alternatively, the second oxide pattern layer 318c-1 may be removed during the immediate previous etching process. Subsequently, as illustrated in FIG. 21, portions of the mold silicon layer 308 and the inner support layer 309 are etched using the first oxide pattern layer 318a-1, the second support pattern layer 315-1, and the first support pattern layer 311-1 as an etch mask to form a mold silicon pattern layer 324 and a first inner support pattern layer 309-1.

When a portion of the mold silicon layer 308 is etched, a hole 323 exposing the pattern layer 302 formed on the cell/peripheral circuit region may be formed. When the mold silicon pattern layer 324 is formed, parts of the buried oxide layer 314 may be further etched. As described above, the mold silicon layer 308 is patterned to align the pattern layer 302 with the mold silicon pattern layer 324 located at an upper level than the pattern layer 302 by using the photo key 304 formed under the buried oxide layer 314.

Figure 22:
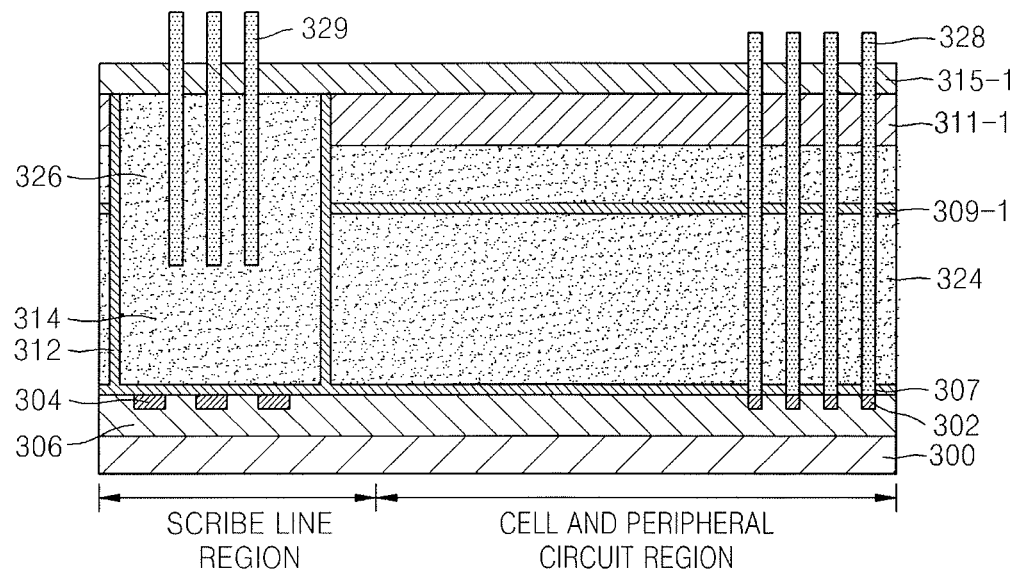

Referring to FIG. 22, in the cell/peripheral circuit region, a lower conductive pattern layer 328 may be formed on the pattern layer 302 between the mold silicon patterns that constitute the mold silicon pattern layer 324. That is, the lower conductive pattern layer 328 may be formed to fill the hole 323 exposing the pattern layer 302 of the cell/peripheral circuit region. Lower conductive pattern layer 329 may also be formed in the buried oxide layer 314. The lower conductive pattern layers 328 and 329 may each be a metal layer, e.g., a titanium/titanium nitride layer. Subsequently, the first oxide pattern layer 318a-1 may be removed.

Figure 23:
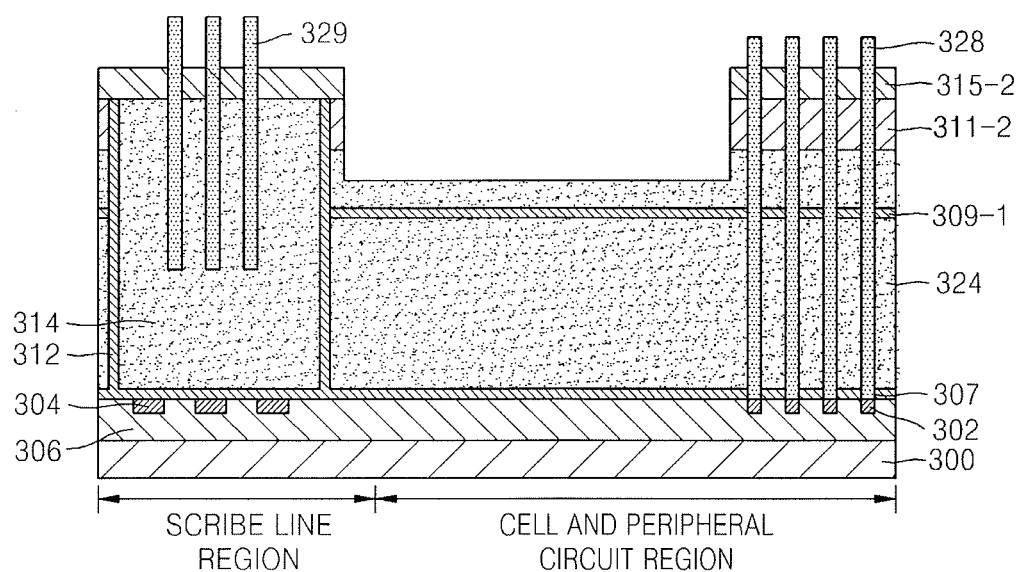

Referring to FIG. 23, the second support pattern layer 315-1 and the first support pattern layer 311-1 are patterned to form a third support pattern layer 311-2 and a fourth support pattern layer 315-2. The third support pattern layer 311-2 and the fourth support pattern layer 315-2 located on the cell/peripheral circuit region may support conductive patterns of the lower conductive pattern layer 328, and the third support pattern layer 311-2 and the fourth support pattern layer 315-2 located on the scribe line region may protect the buried oxide layer 314.

Figure 24:
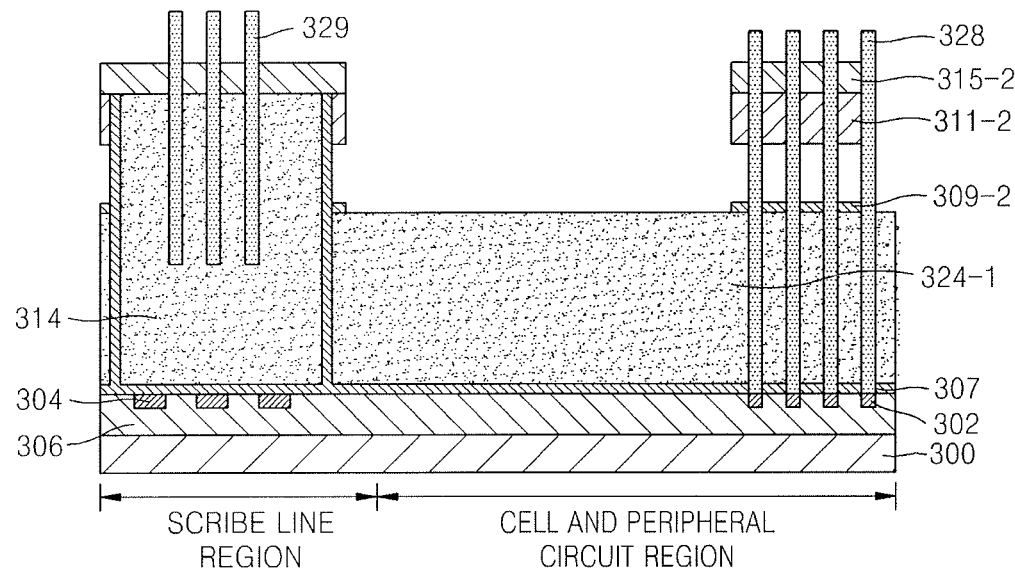

Referring to FIG. 24, while the scribe line region is protected by the third support pattern layer 311-2 and the fourth support pattern layer 315-2, parts of the inner support pattern layer 309-1 and the mold silicon pattern layer 324 in the cell/peripheral circuit region and the scribe line region are etched. Due to the etching, a mold silicon pattern layer 324-1 with a reduced height compared to the mold silicon pattern layer 324 may be formed on the substrate 300, and a second inner support pattern layer 309-2 supporting the lower conductive pattern layer 328 of the cell/peripheral circuit region may be formed.

Figure 25:
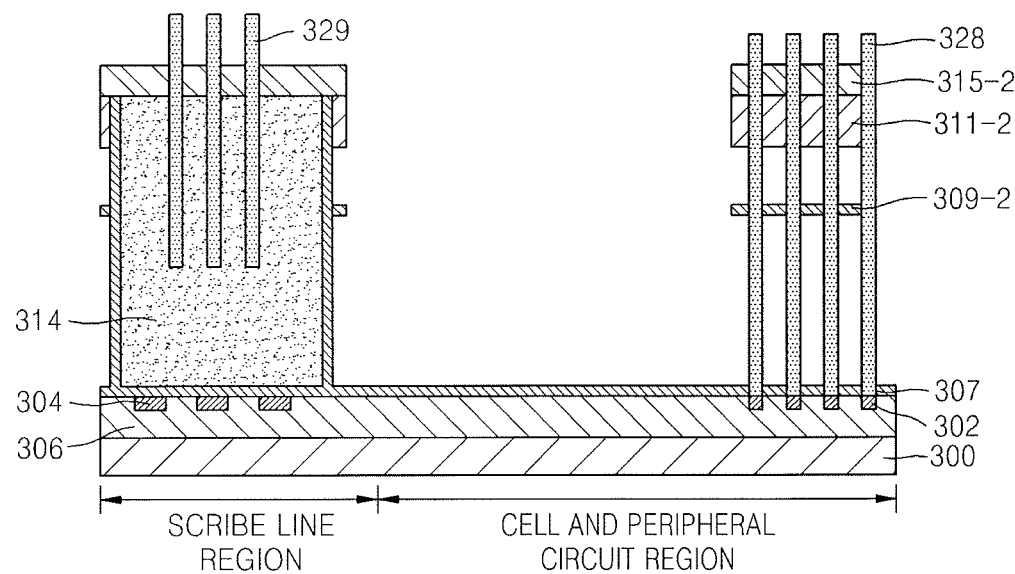
Figures 26, 27:
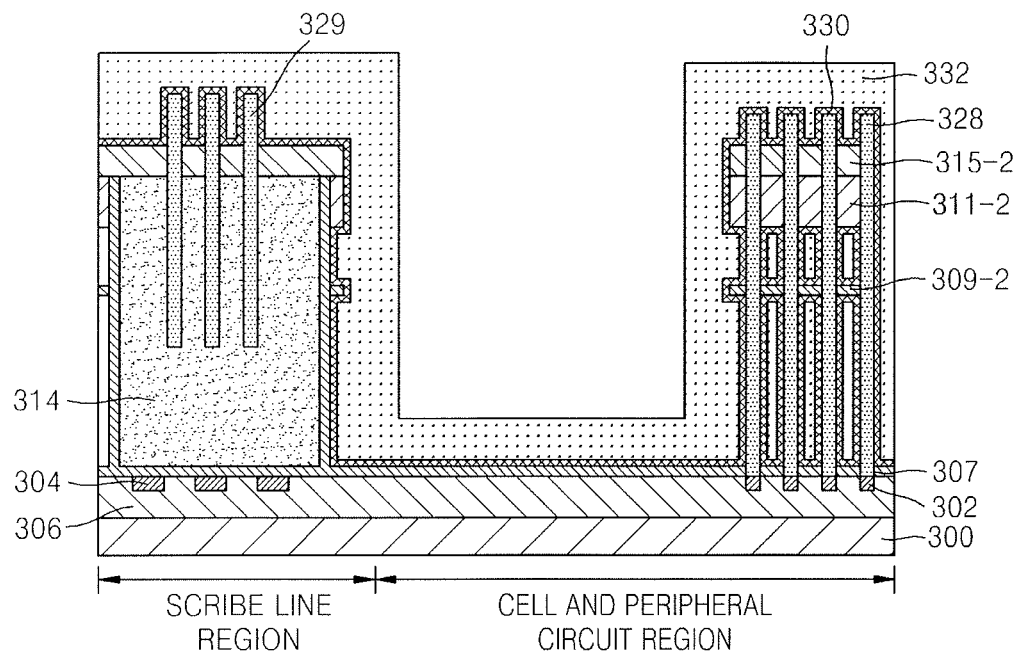
FIG. 27 illustrates a table containing values of an overlay residual occurring when a semiconductor device is fabricated according to an embodiment.

Referring to FIGS. 25 and 26, the mold silicon pattern layer 324-1 with the reduced height is removed. The mold silicon pattern layer 324-1 may be removed by using fluoric acid or LAL. As described above, when the mold silicon pattern layer 324 is removed after the height thereof is reduced, the mold silicon pattern layer 324 may be more easily removed. Subsequently, a dielectric layer 330 and an upper conductive pattern layer 332 are sequentially formed on the lower conductive pattern layer 328 of the cell/peripheral circuit region and the scribe line region. The upper conductive pattern layer 332 may be a metal layer, for example, a titanium/titanium nitride layer or a SiGe layer. By doing so, a capacitor that includes the dielectric layer 330 between the upper conductive pattern layer 332 and the lower conductive pattern layer 328 may be formed.

FIG. 27 shows a table containing values of an overlay residual occurring when a semiconductor device is fabricated according to an embodiment of the inventive concept.

In detail, an overlay residual value refers to a value indicating an alignment state of patterns formed in previous and current processes in the course of the fabrication of a semiconductor device. The overlay residual value may be obtained by measuring the size of patterns formed on a substrate and the size of patterns remaining on the substrate when the patterns and an overlay mark on a reticle overlap and then light is irradiated thereto. That is, when the alignment state of patterns is good, the patterns accurately match with the mark. In this case, the overlay residual value may not exist. When the alignment state of the patterns is bad, the patterns and the marks do not match with each other. In this case, the overlay residual value exists.

When a mold oxide layer is used as a buried oxide layer according to embodiments, the overlay residual value may be about 8 nm. On the other hand, unlike the embodiments of the inventive concept, when a mold silicon layer, instead of the mold oxide layer, is used as the buried oxide layer, an overlay residual may be about 16 nm. Without intending to be bound by theory, a reason for the smaller overlay residual value obtained according to embodiments may be due to the light-transmissibility of the mold oxide layer being higher than that of the mold silicon layer. Ultimately, when a semiconductor device is fabricated according to embodiments, an overlay residual value may be substantially reduced.

Figure 28:
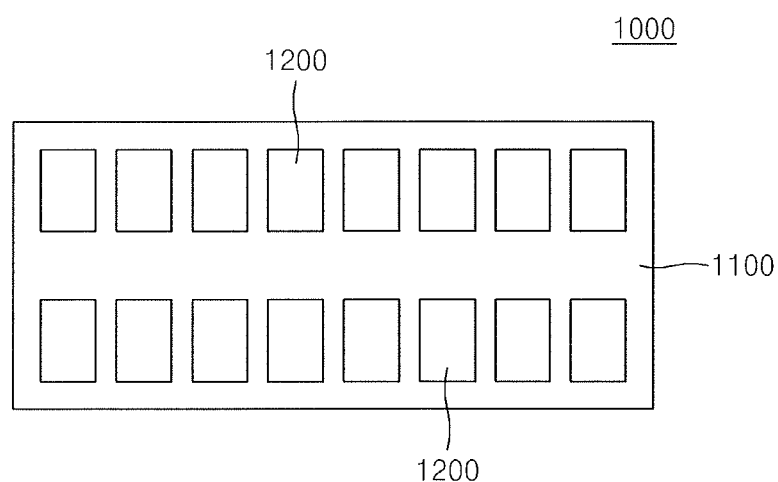
FIG. 28 illustrates a plan view of a memory module including a semiconductor device fabricated by using a method of fabricating a semiconductor device according to an embodiment.

FIG. 28 is a plan view of a memory module 1000 including a semiconductor device fabricated by using a method of fabricating a semiconductor device according to an embodiment. In detail, the memory module 1000 includes a printed circuit substrate 1100 and a plurality of semiconductor packages 1200.

The semiconductor packages 1200 may each include a semiconductor device according to an embodiment. The semiconductor device may be a dynamic random access memory (DRAM). For example, a plurality of semiconductor packages 1200 may have a featured structure of at least one semiconductor device selected from semiconductor devices according to embodiments.

According to an embodiment of the inventive concept, the memory module 1000 may be a single in-lined memory module (SIMM) in which the semiconductor packages 1200 are mounted on a surface of the printed circuit substrate 1100, or a dual in-lined memory module (DIMM) in which the semiconductor packages 1200 are mounted on both surfaces of the semiconductor packages 1200. In addition, according to another embodiment of the inventive concept, the memory module 1000 may be a fully buffered DIMM (FBDIMM) including an advanced memory buffer (AMB) that provides external signals to each of the semiconductor packages 1200.

Figure 29:
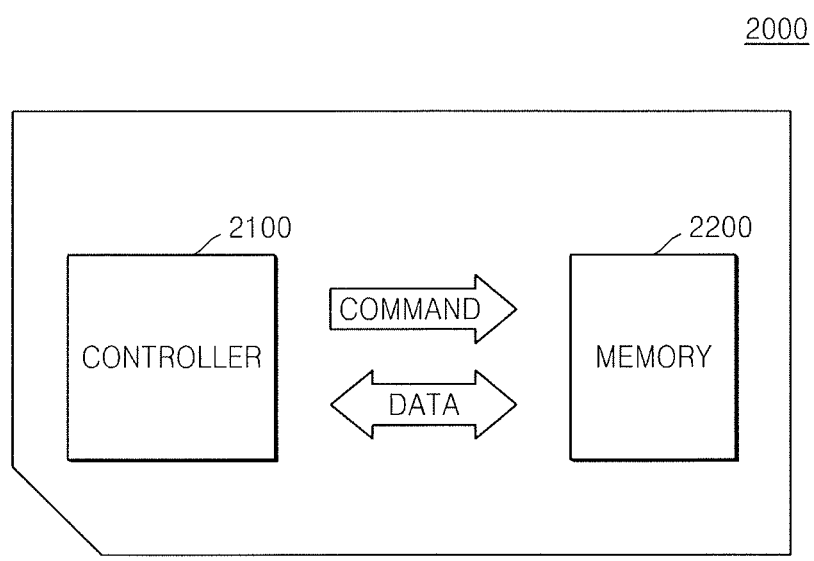
FIG. 29 illustrates a schematic view of a memory card including a semiconductor device fabricated using a method of fabricating a semiconductor device according to an embodiment.

FIG. 29 is a schematic view of a memory card 2000 including a semiconductor device fabricated by using a method of fabricating a semiconductor device according to an embodiment. In detail, the memory card 2000 may include a controller 2100 and a memory 2200 disposed to exchange electrical signals. For example, when the controller 2100 transmits a command, the memory 2200 may transmit data.

The memory 2200 may include a semiconductor device according to an embodiment. In particular, the memory 2200 may have a featured structure of at least one semiconductor device selected from semiconductor devices according to embodiments. The memory card 2000 may be, e.g., a memory stick card, a smart media (SM) card, a secure digital (SD) card, a mini SD card, or a multi media card (MMC), or the like.

Figure 30:
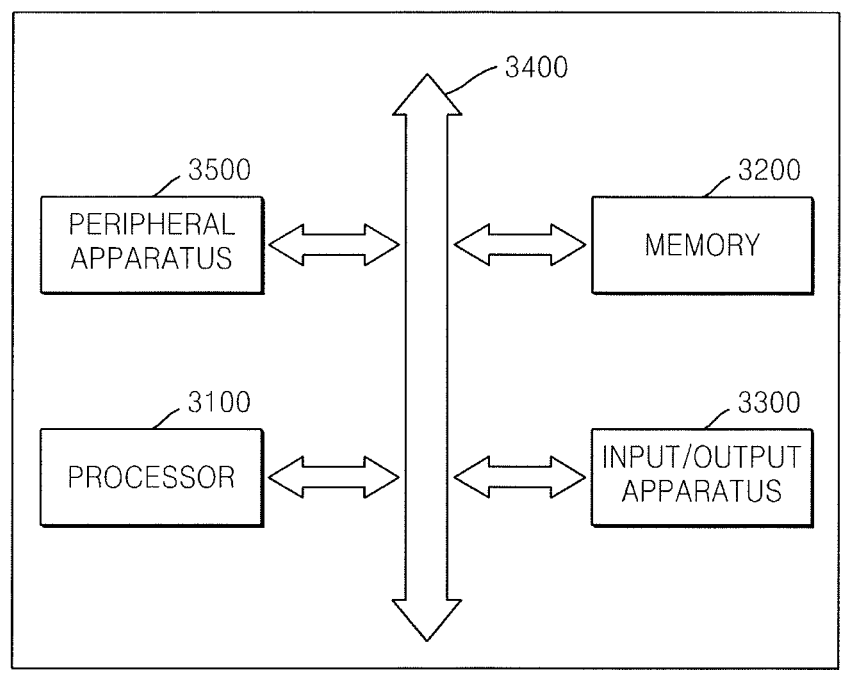
FIG. 30 illustrates a schematic view of a system including a semiconductor device fabricated using a method of fabricating a semiconductor device according to an embodiment.

FIG. 30 is a schematic view of a system 3000 including a semiconductor device fabricated by using a method of fabricating a semiconductor device according to an embodiment. In detail, the system 3000 includes a processor 3100, a memory 3200, and an input/output apparatus 3300 which have inter-data communication via a bus 3400. The memory 3200 of the system 3000 may include a random access memory (RAM) and a read only memory (ROM). In addition, the system 3000 may include a peripheral apparatus 3500, such as a floppy disk drive and a compact disk (CD) ROM drive.

The memory 3200 may include a semiconductor device according to an embodiment. In particular, the memory 3200 may have a featured structure of at least one semiconductor device selected from semiconductor devices according to embodiments.

The memory 3200 may store codes and data for the operation of the processor 3100. The system 3000 may be used in a mobile phone, an MP3 player, a navigation device, a portable multimedia player (PMP), a solid state disk (SSD), or household appliances.

By way of summation and review, one or more embodiments may replace a silicon layer of a second region located at the same level as a silicon layer of a first region with a buried oxide layer. The buried oxide layer formed on a photo key of the second region may be more light-transmissible than the silicon layer of the first region. Accordingly, the photo key of the second region may easily function as an alignment key and an overlay key during an exposure process or an overlay evaluation process.

By way of summation and review, one or more embodiments may replace a silicon layer with a buried oxide layer, on a photo key. Thus, a pattern and a lower conductive pattern layer formed on a substrate are aligned well with each other, and an overlay residual value may be reduced. On or more embodiments may provide a method of fabricating a semiconductor device to increase the accuracy of alignment or overlay of pattern layers by using a photo key Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
    providing a substrate divided into a first region on which a pattern layer is formed and a second region on which a photo key is formed;
    forming a silicon layer on the first region and the second region of the substrate;
    removing a portion of the silicon layer to form a hole exposing the photo key of the second region;
    forming a buried oxide layer to fill the hole exposing the photo key;
    forming a mask layer on the silicon layer and the buried oxide layer;
    forming a photoresist pattern on the mask layer at a higher level than the mask layer by using the photo key formed under the buried oxide layer as an alignment key;
    etching a portion of the mask layer using the photoresist pattern as an etch mask to form a mask pattern layer;
    removing the photoresist pattern; and
    etching portions of the silicon layer using the mask pattern layer as an etch mask to expose the pattern layer of the first region.

2. The method as claimed in claim 1, wherein the buried oxide layer is formed using a damascene method.

3. The method as claimed in claim 2, wherein forming the buried oxide layer comprises:
    forming an oxide layer filling the hole on the entire surface of the first region and the second region; and
    etching the oxide layer using the silicon layer as an etch stopper.

4. The method as claimed in claim 1, wherein forming the photoresist pattern includes using the photo key as an overlay key to align the photoresist pattern with the pattern layer on the substrate.

5. The method as claimed in claim 4, wherein etching portions of the silicon layer comprises exposing the pattern layer formed on the first region.

6. The method as claimed in claim 5, wherein the pattern layer is formed as a metal layer, and the method further comprises, after etching portions of the silicon layer:

forming a conductive layer on the pattern layer of the first region and between silicon patterns remaining;

removing the silicon patterns to form a lower conductive pattern layer; and sequentially forming a dielectric layer and an upper conductive pattern layer on the lower conductive pattern layer to form a capacitor.

7. The method as claimed in claim 1, further comprising forming a liner layer on a bottom and facing surfaces of the hole.

8. The method as claimed in claim 1, wherein the first region is a cell and peripheral circuit region, and the second region is a scribe line region.

9. A method of fabricating a semiconductor device, the method comprising:

providing a substrate divided into a cell and peripheral circuit region on which a pattern layer is formed and a scribe line region on which a photo key is formed;

forming a mold silicon layer on the cell and peripheral circuit region and the scribe line region of the substrate;

removing a portion of the mold silicon layer to form a hole exposing the photo key of the scribe line region;

forming a buried oxide layer to fill the hole exposing the photo key;

forming a support layer on the mold silicon layer and the buried oxide layer;

forming a mask pattern layer on the support layer at a higher level than the support layer using the photo key formed under the buried oxide layer as an alignment key;

etching a portion of the support layer using the mask pattern layer as an etch mask to form a support pattern layer;

removing the mask pattern layer;

etching portions of the mold silicon layer using the support pattern layer as an etch mask to expose the pattern layer of the cell and peripheral circuit region.

10. The method as claimed in claim 9, further comprising forming an inner support layer inside the mold silicon layer.

11. The method as claimed in claim 9, further comprising, following the forming of the buried oxide layer, forming a second support layer on the buried oxide layer and the support layer.

12. A method of fabricating a semiconductor device, the method comprising:

providing a substrate divided into a first region on which a first pattern layer is formed and a second region on which a photo key is formed;

forming a first silicon pattern on the first region and the second region of the substrate, the first silicon pattern including hole exposing the photo key and covering the first region;

filling the hole with a light-transmissive material, the light transmissive material being more light transmissive than silicon;

providing a second pattern layer on the silicon pattern and the light-transmissive material, the second pattern layer being aligned with the photo key; and forming a photoresist pattern on the second pattern layer at a higher level than the second pattern layer by using the photo key formed under the light-transmissive material as an alignment key;

etching a portion of the second pattern layer using the photoresist pattern as an etch mask to form a mask pattern layer;

removing the photoresist pattern; and etching portions of the first silicon pattern using the mask pattern layer as an etch mask to expose the first pattern layer of the first region.

13. The method as claimed in claim 12, wherein the light-transmissive material is a buried oxide layer.

14. The method as claimed in claim 12, wherein the light-transmissive material has an upper surface level with an upper surface of the silicon pattern.

* * * * *